United States Patent
Frey

(10) Patent No.: US 6,281,690 B1
(45) Date of Patent: Aug. 28, 2001

(54) COAXIAL RADIO FREQUENCY TEST PROBE

(75) Inventor: James E. Frey, Salt Lake City, UT (US)

(73) Assignee: Lockheed Martin Corporation, Salt Lake City, UT (US)

( * ) Notice: Subject to any disclaimer, the term of this patent is extended or adjusted under 35 U.S.C. 154(b) by 0 days.

(21) Appl. No.: 08/684,021

(22) Filed: Jul. 19, 1996

(51) Int. Cl.[7] .................................................. G01R 31/02
(52) U.S. Cl. .................................... 324/754; 324/761
(58) Field of Search .................................. 324/754, 755, 324/761, 72.5; 439/482

(56) References Cited

U.S. PATENT DOCUMENTS

| | | | |
|---|---|---|---|
| 4,116,523 | * | 9/1978 | Coberly et al. .................. 324/754 |
| 4,593,243 | * | 6/1986 | Lao et al. .......................... 324/754 |
| 4,829,242 | * | 5/1989 | Carey et al. ...................... 324/754 |
| 4,871,964 | * | 10/1989 | Boll et al. ......................... 324/754 |
| 5,041,782 | * | 8/1991 | Marzan ............................. 324/754 |
| 5,594,358 | * | 1/1997 | Ishikawa et al. ................. 324/754 |

* cited by examiner

*Primary Examiner*—Richard Elms
*Assistant Examiner*—Anh Phung
(74) *Attorney, Agent, or Firm*—Perman & Green, LLP

(57) ABSTRACT

Coaxial RF test probe for trouble-shooting microstrip circuits while minimizing power losses and increasing reliability. The present probes include a coaxial cable, and a grounding pin and a circuit pin supported in isolated, closely-spaced relation to each other, communicating with the outer jacket contact and the central contact, respectively, of the coaxial cable. The pins communicate through a DC block with a testing meter to evaluate predetermined areas of a microstrip circuit while providing fixed-distance grounding to closely-spaced plane areas.

7 Claims, 1 Drawing Sheet

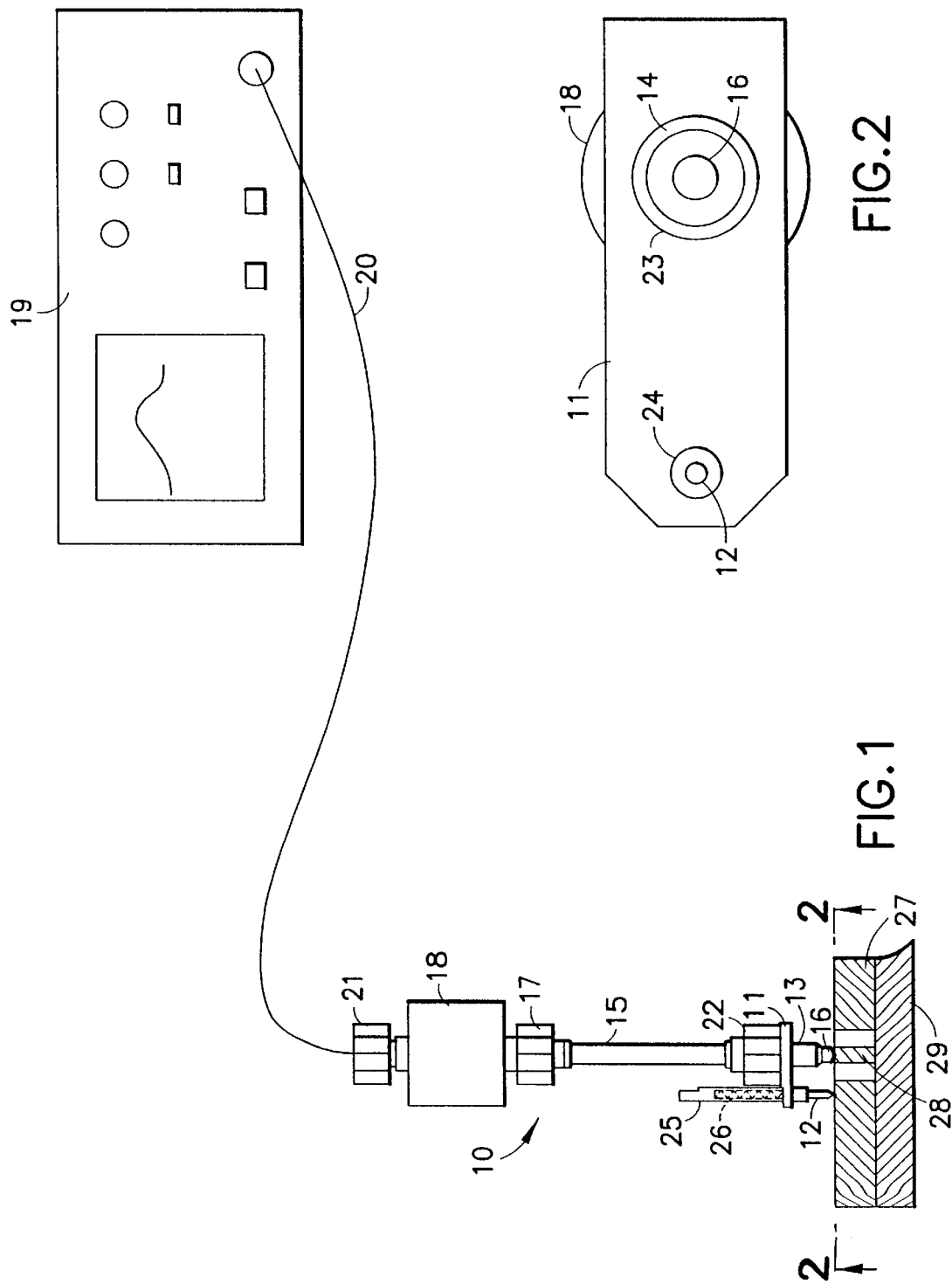

COAXIAL RADIO FREQUENCY TEST PROBE

BACKGROUND OF THE INVENTION

1. Field of the Invention

The present invention relates to an improved coaxial RF probe for testing or trouble-shooting microstrip circuits while avoiding the need for adding conventional coupled test ports or resistive network test ports, which test ports degrade the performance of microstrip circuits, require space and increase the cost and weight of the circuit board.

2. Discussion of the State of the Art

Manufacture and maintenance of a microstrip circuit require that functionality of various stages of the circuit be measurable. In RF circuitry it is conventional to incorporate coupled test ports on resistive network test ports at predetermined critical locations along the microstrip circuit in order to test, measure or trouble-shoot the performance of the circuit at these specific locations.

Such test ports have several disadvantages including being localized, expensive, requiring space and adding weight to the circuit board. More importantly, such test ports degrade the operation or performance of the circuit even when no tests are being performed.

It is also known to test the operation or performance of a microstrip circuit by means of a coaxial RF probe or sniffer probe having a central circuit contact and an outer coaxial jacket contact having a flexible ground wire designed to be clipped to a ground plane area spaced from the microstrip circuit. A DC-blocking device is associated with the central contact in order to provide a contact which protects the sensitive measurement device, such as a spectrum analyzer, power meter or other similar instrument against direct current damage.

While such conventional coaxial RF probes enable testing at any point along a microstrip circuit and avoid the need for test ports on the microstrip circuit, they do not have a reliable grounding system or provide a fixed-distance ground point and therefore their performance is erratic and unreliable. Any coaxial RF probe exhibits high electrical losses, and such losses are unpredictable and variable when the spacing between the microstrip contact and the ground contact is varied.

SUMMARY OF THE INVENTION

The present invention provides a novel, fixed-contact coaxial RF probe which avoids the problems of prior coaxial RF probes by fixing the distance between the circuit contact and the ground plane contact in order to provide reliable and repeatable measurements. The need for test ports, which degrade the performance of the microstrip circuit, is avoided. Also variation in the electrical losses normally encountered with the use of conventional coaxial RF probes having a flexible ground wire, depending upon the arbitrary distance between the ground contact and the microstrip contact, are eliminated so that the losses are predictable and balance each other with repeated measurements. Moreover, the present test probes are easier to use than the prior-known test probes having a flexible wire ground lead which must be clipped or otherwise grounded to a ground plane, in a first operation, prior to the steps of pressing the central test contact against the area of the microstrip circuit being evaluated.

THE DRAWINGS

In the accompanying drawings:

FIG. 1 is a diagrammatic view of a coaxial radio frequency test probe according to a preferred embodiment of the present invention, illustrating the probe in position between a microstrip/ground plane of a printed circuit board and a power measuring device such as a spectrum analyzer, and FIG. 2 is a magnified view of the probe of FIG. 1 taken along the line 2—2 thereof.

DETAILED DESCRIPTION

Referring to the drawings, the coaxial RF test probe 10 thereof is similar in most respects to a conventional coaxial RF test probe except that a conductive receptacle plate 11 supporting a grounding contact pin 12 is soldered in fixed spacing relative to the coaxial circuit contact section 13 of the probe, in electrical connection with the outer conductive jacket 14 of the semi-rigid coaxial cable 15 of the probe and insulated against electrical communication with the central test contact pin 16 of the coaxial cable 15.

The plate 11 and grounding contact pin 12 replace the flexible grounding wire and clip used on prior known coaxial RF test probes on which the grounding wire is soldered or otherwise fixed in electrical connection with the outer conductive jacket of the coaxial cable, and a terminal clip is soldered to the end of the grounding wire for grounding attachment to variable locations of the ground plane of the microstrip circuit board.

The test probe 10 of FIGS. 1 and 2 comprises the semi-rigid coaxial cable section 15 connected by means of an upper jack connector 17 to a conventional coaxial DC block fitting 18 having inside/outside capacitance in series with both the outer conductive jacket 14 and the inner central conductive contact 16 of the cable 15. This prevents or blocks the flow of DC current to the sensitive meter or analyzer 19 while permitting RF power to flow uninterrupted through a length of flexible coaxial cable 20 to the analyzer 19. Cable 20 is connected to the probe 10 by means of an outlet jack connector 21. The DC block fitting preferably is a MDC 1182-A-S18 device commercially-available from MIDISCO, Commack, N.Y. It operates over a frequency range of 0.1 to 18 GHz.

The lower end of the semi-rigid coaxial cable section 15 is connected to the circuit contact section 13 of the probe 10 by means of a lower inlet jack connector 22. The conductive receptacle plate 11 is provided with spaced bores 23 and 24. Bore 23 is slightly larger in diameter than the diameter of the coaxial circuit contact section 13, and the receptacle plate 11 is soldered to the underside of the inlet jack connector 22 and to the outer conductive jacket 14 of the coaxial cable, insulated against electrical connection with the central test contact pin 16 of the coaxial cable. Plate 11 preferably is a passivated stainless steel and may be plated, such as with gold, to improve soldering properties.

The smaller bore 24 of the receptacle plate 11 has a diameter slightly larger than the diameter of the conductive tubular receptical or housing 25 containing an internal spring 26 for spring-loading the pin 12 in adjustable extension from the housing 25. The conductive housing 25 preferably is soldered to the plate 11, within the bore 24, for grounding the contact pin 12 in electrical connection with the plate 11 and with the outer conductive jacket 14 of the coaxial cable 15, insulated from the central conductor or pin 16 of the cable 15. Alternatively, the grounding pin can be soldered to the plate 11, within the bore 24, or may be vertically adjustably engaged therewithin, such as threadably-engaged, for vertical adjustment relative to the length of the contact section 13 and the ground plane height. However, the preferred embodiment involves spring-loading the contact pin 12 within the housing 25, which makes the pin self-adjusting and assures good contact with the grounding plane 27.

The essential novelty of the present test probes is that the circuit contact pin 16 and the grounding contact pin 12 are fixed to the probe in closely spaced relation to each other, whereby electrical losses encountered during use of the probe are minimized and rendered uniform and predictable. Therefore the probe can be calibrated against a standard to allow for the uniform electrical losses.

As illustrated by FIG. 1, the close spacing between the circuit contact pin 16 and the grounding pin 12 requires that the ground plane 27 and the microstrip circuit 28 to be evaluated must be closely spaced on the surface of the printed circuit board (PCB) 29. For example, in a test probe or sniffer for testing 2.0 to 2.5 GH and 50 MHz to 18 GH signals, a preferred spacing between the tips or centers of the pins 12 and 16 is between about 0.2 and 0.3 inch, most preferably about 0.24 inch, which requires that the ground plane and the microstrip are spaced no more than about 0.22 inch. Such probes have been found to encounter power losses between about 10 and 12 dB.

It will be apparent to those skilled in the art that the fixed spacing between the grounding pin 12 and the circuit pin 16 can be greater than 0.3 inch, up to about 0.5 inch, but that the greater spacing produces reduced reliability during testing. For example, the receptical plate 11 can be slightly longer in the horizontal direction to increase the spacing between the bores 23 and 24, or two or more horizontally-spaced alternative bores 24 may be provided in the plate 11 to adapt the probe for alternative use in testing microstrip circuits in which the ground plane is spaced from the microstrip by more than about 0.3 inch, up to about 0.5 inch.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A coaxial RF test probe for evaluating a microstrip circuit which is in proximity to a ground plane, which comprises a semi-rigid coaxial cable having a central conductive contact and an outer tubular contact insulated from each other, a circuit contact pin connected with said central conductive contact, a grounding contact pin connected with said outer tubular contact, and means for supporting said grounding contact pin on said probe in closely-spaced relation to said circuit contact pin to enable the circuit contact pin to be placed into engagement with predetermined areas of a microstrip circuit while the grounding contact pin is placed into engagement with an adjacent ground plane area to conduct RF power from the microwave circuit, through the coaxial cable, to an RF power-measurement device to evaluate the RF power at the predetermined areas of the circuit, wherein the means for supporting the grounding contact pin comprises a conductive plate having a spaced pair of bores, one of which surrounds the coaxial cable and makes conductive contact with the outer tubular contact thereof, and the other bore of which supports said grounding contact pin.

2. A test probe according to claim 1 comprising means for adjustably vertically supporting the grounding contact pin within said other bore.

3. A test probe according to claim 2 in which the grounding contact pin is threadably-engaged within said other bore.

4. A test probe according to claim 1 in which said bores are spaced, center-to-center, by a distance of between about 0.2 and 0.5 inch.

5. A test probe according to claim 4 in which said distance is about 0.24 inch.

6. A test probe according to claim 1 in which the coaxial cable comprises a lower jack connector to said conductive plate and an upper jack connector to an inside/outside DC block which prevents the flow of DC current to the RF power-measurement device.

7. A test probe according to claim 2 in which the adjustably vertically supporting means for the grounding contact pin within said other bore comprises a conductive tubular receptical containing a spring means for spring loading the contact pin in extension from the receptical.

* * * * *